(12) United States Patent
Takachi et al.

(10) Patent No.: US 11,228,837 B2
(45) Date of Patent: Jan. 18, 2022

(54) PROCESSING DEVICE, PROCESSING METHOD, REPRODUCTION METHOD, AND PROGRAM

(71) Applicant: JVCKENWOOD Corporation, Yokohama (JP)

(72) Inventors: Kuniaki Takachi, Yokohama (JP); Hisako Murata, Yokohama (JP); Masaya Konishi, Yokohama (JP); Takahiro Gejo, Yokohama (JP); Yumi Fujii, Yokohama (JP); Toshiaki Nagai, Yokohama (JP)

(73) Assignee: JVCKENWOOD CORPORATION, Yokohama (JP)

( * ) Notice: Subject to any disclaimer, the term of this patent is extended or adjusted under 35 U.S.C. 154(b) by 0 days.

(21) Appl. No.: 17/192,188

(22) Filed: Mar. 4, 2021

(65) Prior Publication Data
US 2021/0195327 A1   Jun. 24, 2021

Related U.S. Application Data

(63) Continuation of application No. PCT/JP2019/036070, filed on Sep. 13, 2019.

(30) Foreign Application Priority Data

Sep. 21, 2018 (JP) .............................. JP2018-176868

(51) Int. Cl.
*H04R 3/04* (2006.01)
*H03G 3/30* (2006.01)
(Continued)

(52) U.S. Cl.
CPC ............. *H04R 3/04* (2013.01); *H03G 3/3005* (2013.01); *H04R 1/22* (2013.01); *H04R 3/02* (2013.01); *H04R 2430/01* (2013.01)

(58) Field of Classification Search
CPC ........ H03R 3/04; H03R 3/02; H03R 2430/01; H03R 1/22; H03G 3/3005; H03G 5/00;
(Continued)

(56) References Cited

U.S. PATENT DOCUMENTS 9,214,916 B2 * 12/2015 Hashimoto .............. H04R 3/04
9,590,580 B1 *  3/2017 You .......................... H04R 3/04
(Continued)

FOREIGN PATENT DOCUMENTS

JP    2012-244246 A    12/2012

*Primary Examiner* — Xu Mei
(74) *Attorney, Agent, or Firm* — Procopio, Cory, Hargreaves & Savitch LLP

(57) ABSTRACT

Provided are an out-of-head localization system, a filter generation device, a method, and a program capable of appropriate processing. A processing device according to an embodiment includes a frequency information acquisition unit that acquires frequency information on the basis of a frequency response of a filter used in filter processing on a reproduction signal, a time information acquisition unit that acquires, on the basis of the frequency information, time information of a reproduction signal, a time signal extraction unit that extracts, on the basis of the time information, a time signal corresponding to at least some time of the reproduction signal, a filter processing unit that performs filter processing on the time signal, and a gain acquisition unit that acquires a gain on the basis of the time signal not having undergone filter processing and a processed time signal having undergone filter processing.

7 Claims, 7 Drawing Sheets

(51) Int. Cl.
*H04R 1/22* (2006.01)
*H04R 3/02* (2006.01)

(58) Field of Classification Search
CPC .......... H03G 5/20; H03G 5/025; H04S 1/005;
H04S 2420/01; H04S 2400/13
USPC .................................. 381/94, 104, 107, 109
See application file for complete search history.

(56) References Cited

U.S. PATENT DOCUMENTS

| | | | |
|---|---|---|---|
| 9,734,841 B2* | 8/2017 | Yamabe | G10L 25/48 |
| 10,396,745 B2* | 8/2019 | Watanabe | H03H 17/0213 |
| 10,405,127 B2* | 9/2019 | Murata | H04R 3/00 |
| 2004/0213420 A1* | 10/2004 | Gundry | H03G 9/10 |
| | | | 381/104 |
| 2008/0187149 A1* | 8/2008 | Jung | H03G 9/025 |
| | | | 381/72 |
| 2009/0220109 A1* | 9/2009 | Crockett | H03G 9/005 |
| | | | 381/107 |
| 2012/0294461 A1 | 11/2012 | Maeda et al. | |

\* cited by examiner

PROCESSING DEVICE, PROCESSING METHOD, REPRODUCTION METHOD, AND PROGRAM

CROSS REFERENCE TO RELATED APPLICATION

This application is a Bypass Continuation of PCT/JP2019/036070 filed on Sep. 13, 2019, which is based upon and claims the benefit of priority from Japanese patent application No. 2018-176868 filed on Sep. 21, 2018, the disclosure of which is incorporated herein in its entirety by reference.

BACKGROUND

The present invention relates to a processing device, a processing method, a reproduction device, and a program.

Patent Literature 1 discloses a sound volume correction device that corrects the sound volume of an acoustic signal. The sound volume correction device disclosed in Patent Literature 1 averages signal levels in each frequency band of an acoustic signal by different averaging time. The sound volume correction device assigns weights to a plurality of average values and obtains a weighted representative value. The sound volume correction device determines a gain on the basis of the representative value, and corrects the sound volume on the basis of this gain.

Sound localization techniques include an out-of-head localization technique, which localizes sound images outside the head of a listener by using headphones. The out-of-head localization technique localizes sound images outside the head by canceling characteristics from the headphones to the ears and giving four characteristics (spatial acoustic transfer characteristics) from stereo speakers to the ears.

In out-of-head localization reproduction, measurement signals (impulse sounds etc.) that are output from 2-channel (which is referred to hereinafter as "ch") speakers are recorded by microphones (which can be also called "mike") placed on the ears of a listener. Then, a processing device generates a filter on the basis of a sound pickup signal obtained by collecting measurement signals. The generated filter is convolved to 2-ch audio signals, thereby implementing out-of-head localization reproduction.

Further, in order to generate a filter that cancels out characteristics from headphones to the ears, characteristics from headphones to the ears or eardrums (ear canal transfer function ECTF; also referred to as ear canal transfer characteristics) are measured by the microphones placed on the ears of the listener.

CITATION LIST

Patent Literature

PTL1: Japanese Unexamined Patent Application Publication No. 2012-244246

SUMMARY

In some cases, filter processing that emphasizes a certain frequency is performed in an out-of-head localization device, equalizing or the like. In such a case, the sound quality or filter characteristics can be degraded in a certain sound source to be reproduced or a certain frequency response of a filter. This can give a feeling of strangeness to a user.

In the device disclosed in Patent Literature 1, it is necessary to monitor the signal level of a sound source at all times, which imposes a heavy processing load on a reproduction device. Further, although a feeling of strangeness caused by a change in sound volume occurring during reproduction of a sound source is reduced, it is not completely eliminated.

The present embodiment has been accomplished to solve the above problems and an object of the present invention is thus to provide a processing device, a processing method, and a program capable of appropriately setting a gain value.

A processing device according to an embodiment includes a frequency information acquisition unit configured to acquire frequency information on the basis of a frequency response of a filter used in filter processing on a reproduction signal, a time information acquisition unit configured to acquire, on the basis of the frequency information, time information of a reproduction signal, an extraction unit configured to extract, on the basis of the time information, a time signal corresponding to at least some time of the reproduction signal, a filter processing unit configured to perform filter processing using the filter on the time signal, and a gain acquisition unit configured to acquire a gain for a sound volume of the reproduction signal on the basis of the time signal not having undergone filter processing and a processed time signal having undergone filter processing.

A processing method according to an embodiment includes a step of acquiring frequency information on the basis of a frequency response of a filter used in filter processing on a reproduction signal, a step of acquiring, on the basis of the frequency information, time information of a reproduction signal, a step of extracting, on the basis of the time information, a time signal corresponding to at least some time of the reproduction signal, a step of performing filter processing using the filter on the time signal, and a step of acquiring a gain for a sound volume of the reproduction signal on the basis of the time signal not having undergone filter processing and a processed time signal having undergone filter processing.

A computer program according to an embodiment is a program causing a computer to perform a processing method, the processing method including a step of acquiring frequency information on the basis of a frequency response of a filter used in filter processing on a reproduction signal, a step of acquiring, on the basis of the frequency information, time information of a reproduction signal, a step of extracting, on the basis of the time information, a time signal corresponding to at least some time of the reproduction signal, a step of performing filter processing using the filter on the time signal, and a step of acquiring a gain for a sound volume of the reproduction signal on the basis of the time signal not having undergone filter processing and a processed time signal having undergone filter processing.

According to the embodiment, there are provided a processing device, a processing method, and a program capable of appropriately setting a gain value.

DETAILED DESCRIPTION

The overview of a sound localization process according to an embodiment is described hereinafter. An out-of-head localization process according to this embodiment performs out-of-head localization by using spatial acoustic transfer characteristics and ear canal transfer characteristics. The spatial acoustic transfer characteristics are transfer characteristics from a sound source such as speakers to the ear canal. The ear canal transfer characteristics are transfer characteristics from a headphone or earphone speaker unit to the eardrum. In this embodiment, out-of-head localization is implemented by measuring the spatial sound transfer characteristics when headphones or earphones are not worn, measuring the ear canal transfer characteristics when headphones or earphones are worn, and using those measurement data. This embodiment has a feature in a microphone system for measuring spatial acoustic transfer characteristics or ear canal transfer characteristics.

The out-of-head localization process according to this embodiment is performed by a user terminal such as a personal computer, a smart phone, or a tablet PC. The user terminal is an information processor including a processing means such as a processor, a storage means such as a memory or a hard disk, a display means such as a liquid crystal monitor, and an input means such as a touch panel, a button, a keyboard and a mouse. The user terminal may have a communication function to transmit and receive data. Further, an output means (output unit) with headphones or earphones is connected to the user terminal. Connection between the user terminal and the output means may be wired connection or wireless connection.

First Embodiment (Out-of-Head Localization Device)

Figure 1:
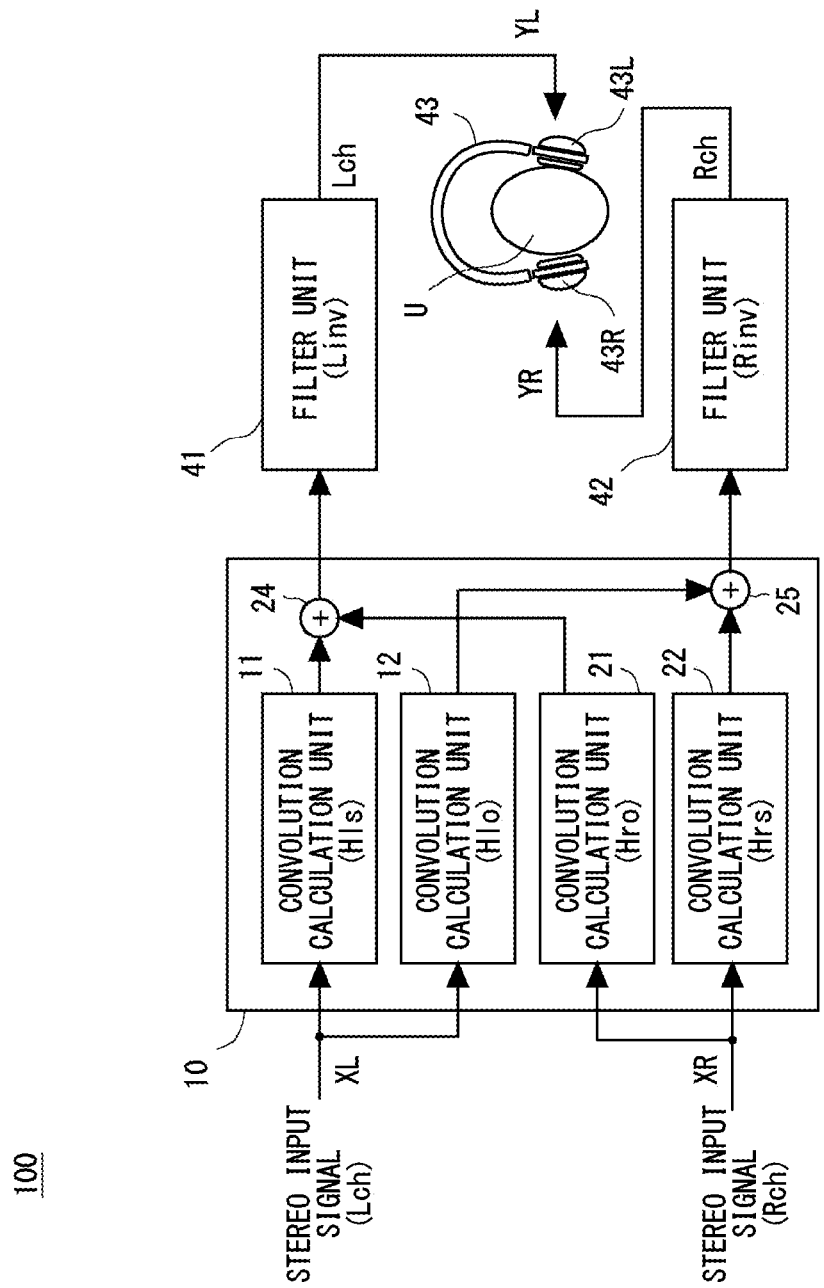
FIG. 1 is a block diagram showing an out-of-head localization device according to an embodiment.

FIG. 1 shows a block diagram of an out-of-head localization device 100, which is an example of a sound field reproduction device according to this embodiment. The out-of-head localization device 100 reproduces sound fields for a user U who is wearing headphones 43. Thus, the out-of-head localization device 100 performs sound localization for L-ch and R-ch stereo input signals XL and XR. The L-ch and R-ch stereo input signals XL and XR are analog audio reproduction signals that are output from a CD (Compact Disc) player or the like or digital audio data such as mp3 (MPEG Audio Layer-3). Note that the audio reproduction signals or the digital audio data are collectively referred to as reproduction signals. Thus, the L-ch and R-ch stereo input signals XL and XR are the reproduction signals.

Note that the out-of-head localization device 100 is not limited to a physically single device, and a part of processing may be performed in a different device. For example, a part of processing may be performed by a personal computer or the like, and the rest of processing may be performed by a DSP (Digital Signal Processor) included in the headphones 43 or the like.

The out-of-head localization device 100 includes an out-of-head localization unit 10, a filter unit 41 that stores an inverse filter Linv, a filter unit 42 that stores an inverse filter Rinv, and headphones 43. The out-of-head localization unit 10, the filter unit 41 and the filter unit 42 can be implemented by a processor or the like, to be specific.

The out-of-head localization unit 10 includes convolution calculation units 11 to 12 and 21 to 22 that store spatial acoustic transfer characteristics Hls, Hlo, Hro and Hrs, and adders 24 and 25. The convolution calculation units 11 to 12 and 21 to 22 perform convolution processing using the spatial acoustic transfer characteristics. The stereo input signals XL and XR from a CD player or the like are input to the out-of-head localization unit 10. The spatial acoustic transfer characteristics are set to the out-of-head localization unit 10. The out-of-head localization unit 10 convolves a filter of the spatial acoustic transfer characteristics (which is referred hereinafter also as a spatial acoustic filter) into each of the stereo input signals XL and XR having the respective channels. The spatial acoustic transfer characteristics may be a head-related transfer function HRTF measured in the head or auricle of a measured person, or may be the head-related transfer function of a dummy head or a third person.

The spatial acoustic transfer characteristics are a set of four spatial acoustic transfer characteristics Hls, Hlo, Hro and Hrs. Data used for convolution in the convolution calculation units 11 to 12 and 21 to 22 is a spatial acoustic filter. The spatial acoustic filter is generated by cutting out the spatial acoustic transfer characteristics Hls, Hlo, Hro and Hrs with a specified filter length.

Each of the spatial acoustic transfer characteristics Hls, Hlo, Hro and Hrs is acquired in advance by impulse response measurement or the like. For example, the user U wears microphones on the left and right ears, respectively. Left and right speakers placed in front of the user U output impulse sounds for performing impulse response measurement. Then, the microphones pick up measurement signals such as the impulse sounds output from the speakers. The spatial acoustic transfer characteristics Hls, Hlo, Hro and Hrs are acquired on the basis of sound pickup signals in the microphones. The spatial acoustic transfer characteristics Hls between the left speaker and the left microphone, the spatial acoustic transfer characteristics Hlo between the left speaker and the right microphone, the spatial acoustic transfer characteristics Hro between the right speaker and the left microphone, and the spatial acoustic transfer characteristics Hrs between the right speaker and the right microphone are measured.

The convolution calculation unit 11 convolves the spatial acoustic filter appropriate to the spatial acoustic transfer characteristics Hls to the L-ch stereo input signal XL. The convolution calculation unit 11 outputs convolution calculation data to the adder 24. The convolution calculation unit 21 convolves the spatial acoustic filter appropriate to the spatial acoustic transfer characteristics Hro to the R-ch stereo input signal XR. The convolution calculation unit 21 outputs convolution calculation data to the adder 24. The adder 24 adds the two convolution calculation data and outputs the data to the filter unit 41.

The convolution calculation unit 12 convolves the spatial acoustic filter appropriate to the spatial acoustic transfer characteristics Hlo to the L-ch stereo input signal XL. The convolution calculation unit 12 outputs convolution calculation data to the adder 25. The convolution calculation unit 22 convolves the spatial acoustic filter appropriate to the spatial acoustic transfer characteristics Hrs to the R-ch stereo input signal XR. The convolution calculation unit 22 outputs convolution calculation data to the adder 25. The adder 25 adds the two convolution calculation data and outputs the data to the filter unit 42.

Inverse filters Linv and Rinv that cancel out the headphone characteristics (characteristics between a reproduction unit of headphones and a microphone) are set to the filter units 41 and 42, respectively. Then, the inverse filters Linv and Rinv are convolved to the reproduction signals (convolution calculation signals) on which processing in the out-of-head localization unit 10 has been performed. The filter unit 41 convolves the inverse filter Linv with the L-ch headphone characteristics to the L-ch signal from the adder 24. Likewise, the filter unit 42 convolves the inverse filter Rinv with the R-ch headphone characteristics to the R-ch signal from the adder 25. The inverse filters Linv and Rinv cancel out the characteristics from the headphone unit to the microphone when the headphones 43 are worn. The microphone may be placed at any position between the entrance of the ear canal and the eardrum.

The filter unit 41 outputs a processed L-ch signal YL to a left unit 43L of the headphones 43. The filter unit 42 outputs a processed R-ch signal YR to a right unit 43R of the headphones 43. The user U is wearing the headphones 43. The headphones 43 output the L-ch signal YL and the R-ch signal YR (the L-ch signal YL and the R-ch signal YR are hereinafter referred to collectively as stereo signals) toward the user U. This enables reproduction of sound images localized outside the head of the user U.

As described above, the out-of-head localization device 100 performs out-of-head localization by using the spatial acoustic filters appropriate to the spatial acoustic transfer characteristics Hls, Hlo, Hro and Hrs and the inverse filters Linv and Rinv with the headphone characteristics. In the following description, the spatial acoustic filters appropriate to the spatial acoustic transfer characteristics Hls, Hlo, Hro and Hrs and the inverse filters Linv and Rinv with the headphone characteristics are referred to collectively as an out-of-head localization filter. In the case of 2ch stereo reproduction signals, the out-of-head localization filter is composed of four spatial acoustic filters and two inverse filters. The out-of-head localization device 100 then carries out convolution calculation on the stereo reproduction signals by using the total six out-of-head localization filters and thereby performs out-of-head localization. The out-of-head localization filters are preferably based on measurement of the individual user U. For example, the out-of-head localization filters are set on the basis of sound pickup signals picked up by the microphones worn on the ears of the user U.

As described above, the spatial acoustic filters and the inverse filters of the headphone characteristics are filters for audio signals. Those filters are convolved to the reproduction signals (stereo input signals XL and XR), and thereby the out-of-head localization device 100 carries out out-of-head localization.

(Processing Device)

Figure 2:
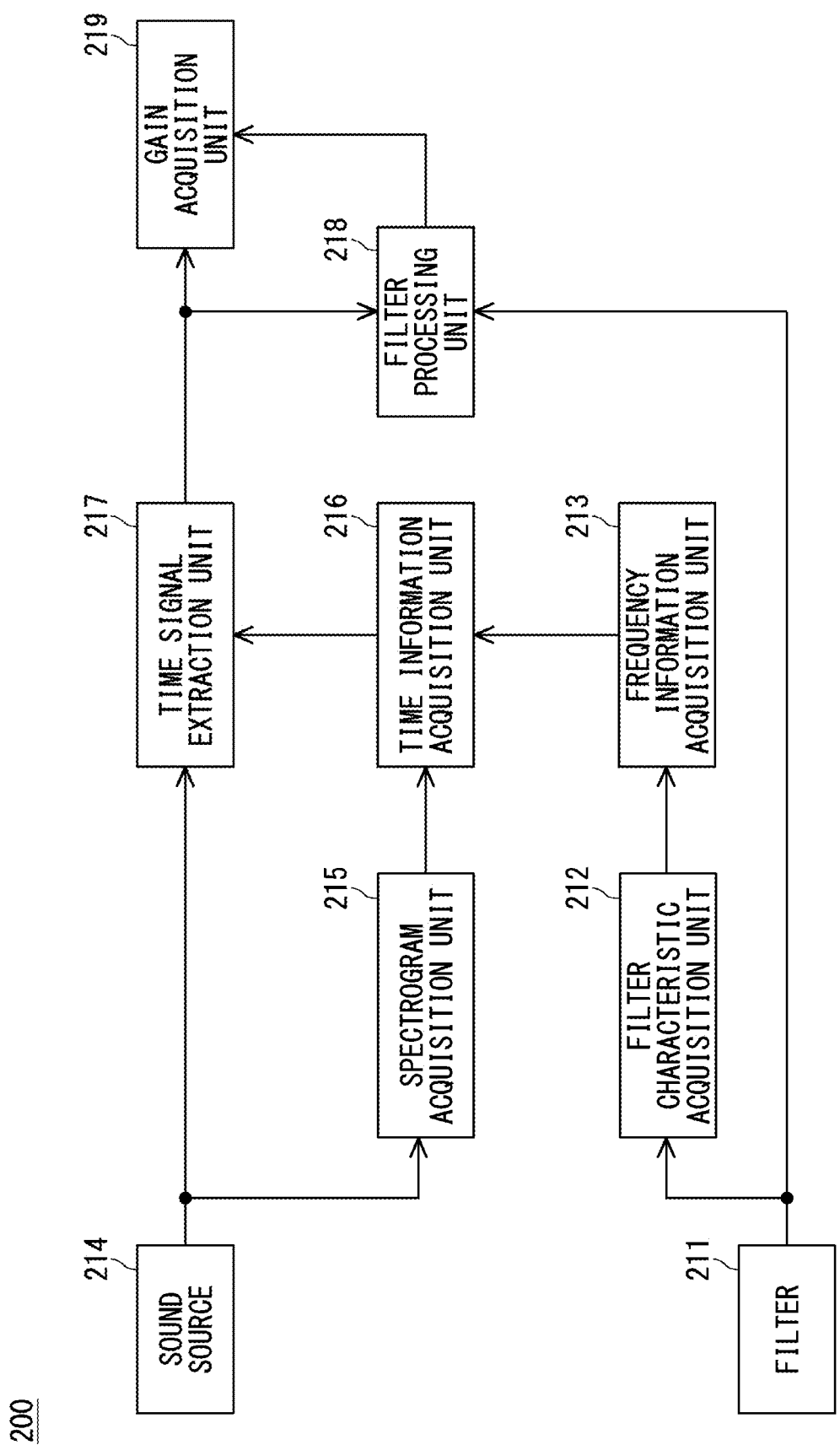
FIG. 2 is a block diagram showing the structure of a processing device that performs processing for setting a gain value.

A processing device 200 and a processing method according to this embodiment are described hereinafter with reference to FIG. 2. FIG. 2 is a block diagram showing the structure of the processing device 200. The processing device 200 may be a common device to the out-of-head localization device 100 shown in FIG. 1. Alternatively, a part or the whole of the processing device 200 may be a different device from the out-of-head localization device 100.

The processing device 200 includes a filter 211, a filter characteristic acquisition unit 212, a frequency information acquisition unit 213, a sound source 214, a spectrogram acquisition unit 215, a time information acquisition unit 216, and a time signal extraction unit 217, a filter processing unit 218, and a gain acquisition unit 219.

In the filter 211, data of out-of-head localization, which are the spatial acoustic filters appropriate to the spatial acoustic transfer characteristics Hls, Hlo, Hro and Hrs and the inverse filters Linv and Rinv with the headphone characteristics, are stored. An example of performing processing using the inverse filter Linv is described hereinafter. Processing using another filter may be performed as a matter of course. The filter 211 is input to the filter characteristic acquisition unit 212 and the filter processing unit 218. In the case where the processing device 200 and the out-of-head localization device 100 are different devices, the processing device 200 acquires data of the filter 211 from the out-of-head localization device 100 by wireless communication or wired communication.

In the sound source 214, data of a reproduction signal s[t] to be reproduced by the out-of-head localization device is stored. Note that the reproduction signal s[t] is, for example, a song to be reproduced for out-of-head localization listening. Thus, data of a reproduction signal of one song is stored in the sound source 214.

Figure 3:
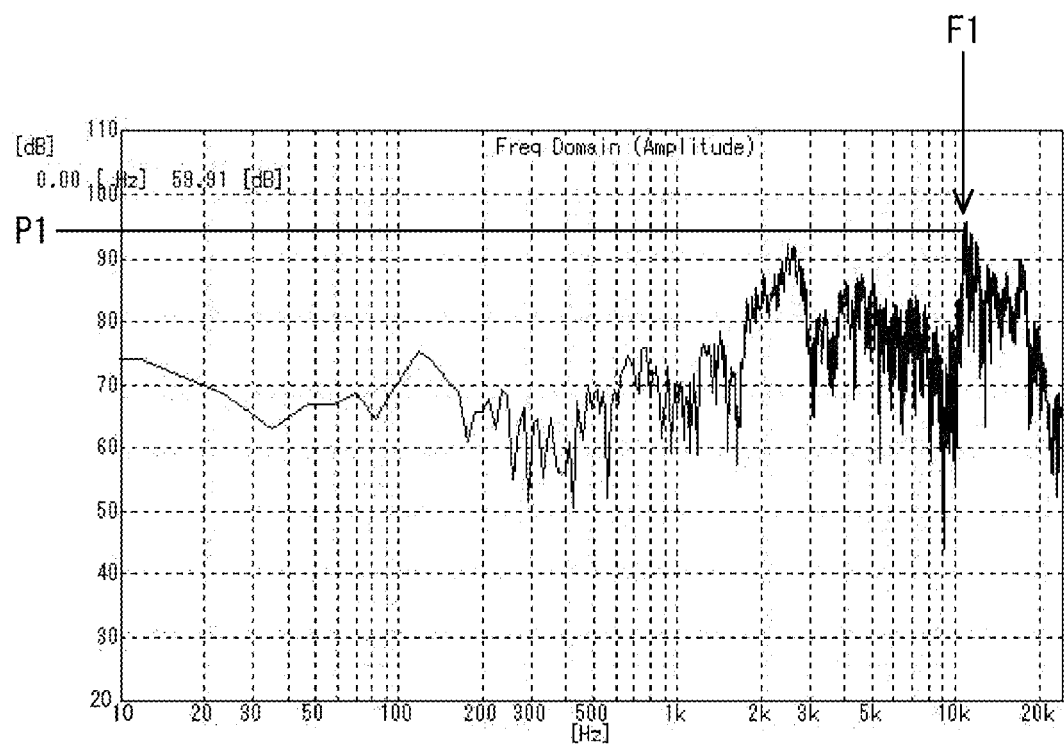
FIG. 3 is a view showing the frequency response of a filter.

The filter characteristic acquisition unit 212 acquires the frequency response of the filter 211. The filter characteristic acquisition unit 212 calculates a spectrum in the frequency domain from a filter in the time domain by FFT (fast Fourier transform). The amplitude characteristics (amplitude spectrum) and the phase characteristics (phase spectrum) of the filter are thereby generated. FIG. 3 shows an example of a frequency response F[w] obtained by performing FFT of a filter f(t) in the time domain. Note that t indicates time and w indicates a frequency. The filter characteristic acquisition unit 212 outputs the frequency response F[w] to the frequency information acquisition unit 213.

Note that a power spectrum may be used as the frequency response instead of the amplitude spectrum. The filter characteristic acquisition unit 212 can transform the filter into data in the frequency domain (frequency response) by discrete Fourier transform or discrete cosine transform. The out-of-head localization device 100 may calculate the frequency response as a matter of course. In this case, the processing device 200 may acquire the frequency response transmitted from the out-of-head localization device 100.

The frequency information acquisition unit 213 acquires frequency information on the basis of the frequency response F[w] of the filter. The frequency information is information indicating a frequency to evaluate a sound volume. The frequency information is a peak frequency at which the frequency response of the filter reaches its peak, for example. To be more specific, the frequency information acquisition unit 213 determines a frequency with the maximum amplitude in the frequency response F[w] as a peak frequency F1. The frequency information acquisition unit 213 then acquires the peak frequency F1 as the frequency information. FIG. 3 shows the peak frequency F1 and the maximum amplitude P1 at the peak frequency F1. The frequency information acquisition unit 213 outputs the frequency information to the time information acquisition unit 216.

Figure 4:
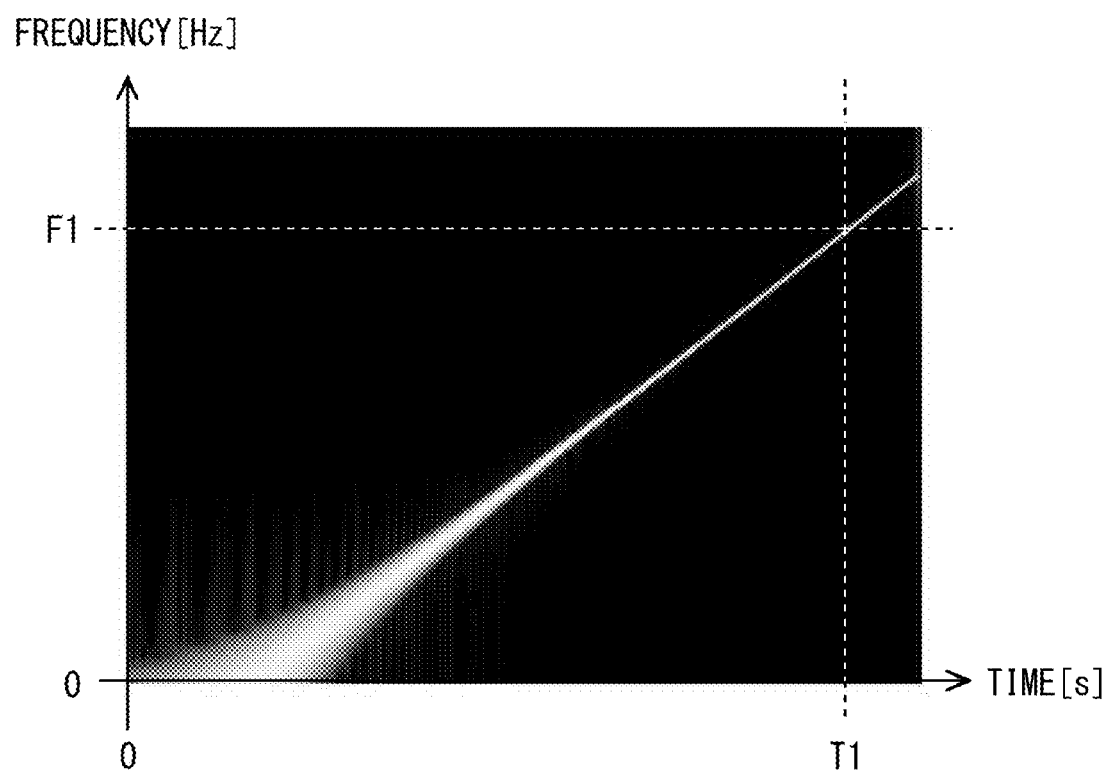
FIG. 4 is a view showing the spectrogram of a reproduction signal.

The spectrogram acquisition unit 215 acquires a spectrogram S[t,w] of a reproduction signal. The spectrogram S[t,w] is data that represents an amplitude by a luminance, for example, where the horizontal axis is time t and the vertical axis is the frequency w. FIG. 4 shows a spectrogram S[t,w] in the case where a sweep signal is the reproduction signal. In FIG. 4, the amplitude increases as it is closer to white, and the amplitude decreases as it is closer to black. Specifically, the amplitude is represented by a multi-tone gray scale, and the amplitude increases as the tone is closer to white than black.

The spectrogram acquisition unit 215 can generate the spectrogram S[t,w] by a method of using a band-pass filter group (filter bank) or by STFT (Short-Time Fourier Transform), for example. Further, the spectrogram S[t,w] may be generated when a song to be reproduced is designated, or may be generated in advance before a song to be reproduced is designated. The spectrogram acquisition unit 215 outputs the spectrogram S[t,w] to the time information acquisition unit 216.

The time information acquisition unit 216 acquires time information on the basis of the frequency information and the reproduction signal. The time information is information indicating time to evaluate a sound volume. The time information acquisition unit 216 refers to the spectrogram S[t,w] and acquires, as the time information, a peak time T1 at which the spectrogram S[t,w] at the peak frequency F1 reaches its peak, for example. Specifically, the peak time T1 is time at which the sound volume of the reproduction signal reaches its maximum at the peak frequency F1. The spectrogram of FIG. 4 shows the peak frequency F1 and the peak time T1. The time information acquisition unit 216 outputs the time information to the time signal extraction unit 217.

The time signal extraction unit 217 extracts a time signal A corresponding to at least some time of the reproduction signal s[t] on the basis of the time information. For example, the time signal extraction unit 217 cuts outs the time signal A from the reproduction signal s[t] on the basis of the peak time T1. To be specific, the time signal A is a signal whose start time is the peak time T1 and whose duration corresponds to one frame length of FFT. The time signal extraction unit 217 outputs the time signal A to the filter processing unit 218 and the gain acquisition unit 219. Note that the start time may be a time slightly (for example, several samples to several dozen samples) earlier than the peak time T1. Further, although the time signal A is a part of the reproduction signal s[t] in this example, it may be the whole of the reproduction signal s[t].

Next, the filter processing unit 218 performs filter processing on the time signal A by using the filter 211. Specifically, the inverse filter Linv is convolved to the extracted time signal. The time signal on which filter processing has been performed is referred to as a processed time signal FA.

The gain acquisition unit 219 acquires a gain on the basis of the time signals before and after performing filter processing. For example, the gain acquisition unit 219 compares the time signal A with the processed time signal FA and thereby calculates a gain G=Ap/FAp, where Ap is the maximum amplitude of the time signal A, and FAp is the maximum amplitude of the processed time signal FA. In this manner, the gain acquisition unit 219 calculates the gain G that is most appropriate for the reproduction signal on the basis of the time signal A and the processed time signal FA. A gain appropriate for the reproduction signal and the filter is thereby obtained.

Then, the gain acquisition unit 219 outputs the gain G to the out-of-head localization device 100. The out-of-head localization device 100 reproduces the reproduction signal on which out-of-head localization is performed at a sound volume depending on the gain G. The user U can thereby listen to the reproduction signal on which out-of-head localization is performed without a feeling of strangeness.

Since a filter for out-of-head localization is different from user to user, the sound volume can be appropriately corrected for each user. Further, the sound volume appropriately for the reproduction signal can be corrected for each reproduction signal, which is, for each song. Further, since the most appropriate gain is obtained before reproduction of the reproduction signal, there is no need to perform processing during reproduction.

Figure 5:
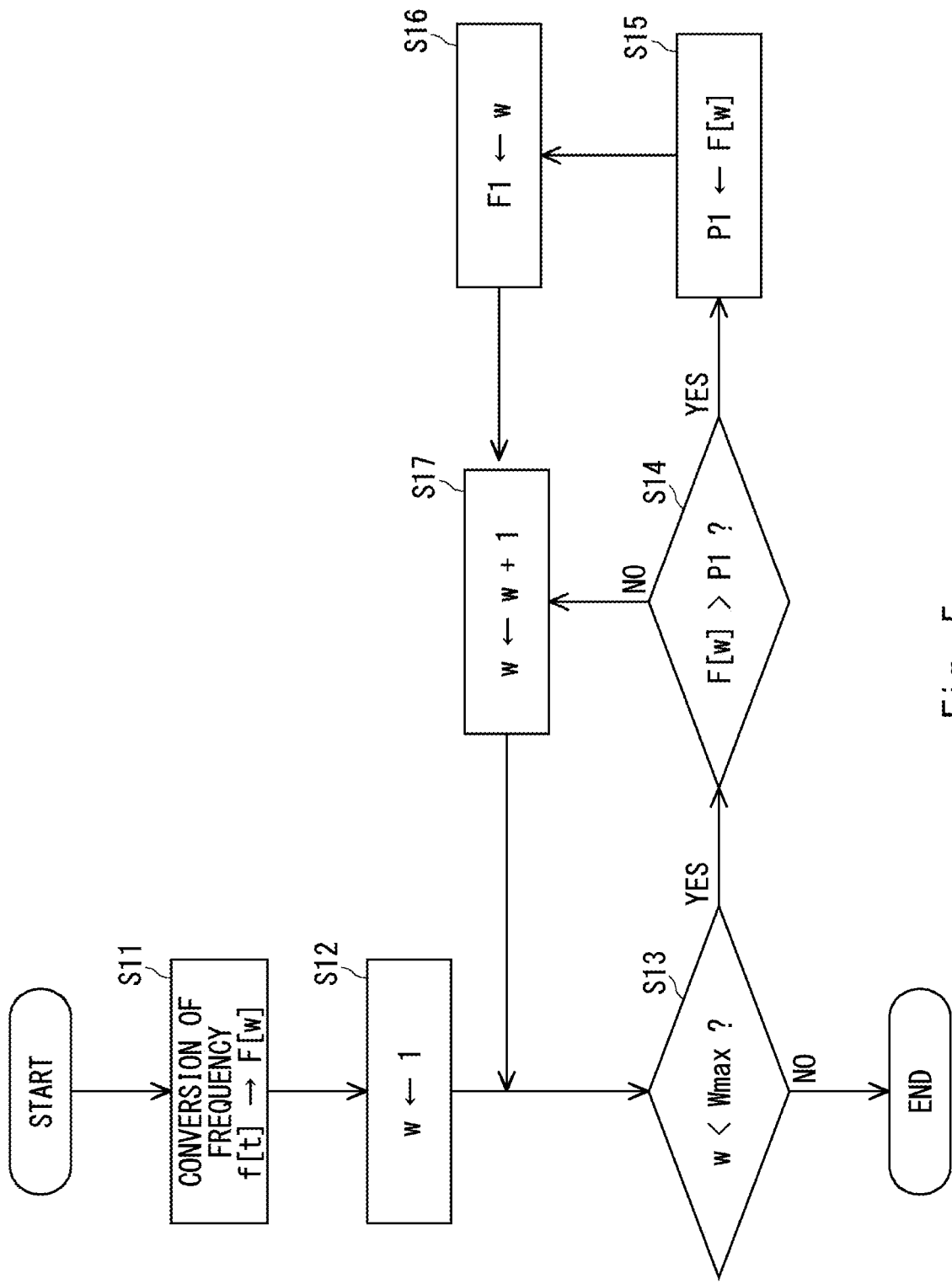
FIG. 5 is a flowchart illustrating a process of acquiring frequency information.

A process of acquiring the frequency information is described hereinafter in detail with reference to FIG. 5. FIG. 5 is a flowchart showing an example of processing in the filter characteristic acquisition unit 212 and the frequency information acquisition unit 213.

First, the filter characteristic acquisition unit 212 performs frequency conversion of a filter f[t] and thereby obtains a frequency response F[w] (S11). In this example, the frequency response F[w] is an amplitude spectrum obtained by performing FFT in the filter characteristic acquisition unit 212. The frequency w is an integer indicating a discrete frequency obtained by FFT. To be specific, w is an integer of 1 to Wmax. Note that the frequency is not necessarily an integer, and a frequency other than an integer may be used by, for example, assigning numbers to discrete frequencies and manage them in a table or the like, and inputting the frequencies in the table to w in numerical order according to increment of w, which is described later.

Next, the frequency information acquisition unit 213 inputs 1 to w as an initial value (S12). The frequency information acquisition unit 213 then determines whether w is smaller than Wmax (S13). Note that Wmax is an integer corresponding to the maximum frequency of the frequency response F[w]. When w is smaller than Wmax (Yes in S13), it is determined whether F[w] is greater than P1 (S14). P1 is the maximum amplitude at a frequency less than the frequency w.

When F[w] is greater than P1 (Yes in S14), the frequency information acquisition unit 213 inputs F[w] to P1 (S15). Further, the frequency information acquisition unit 213 inputs w to the peak frequency F1 (S16). In other words, the frequency information acquisition unit 213 updates P1 by using F[w] and updates F1 by using w. Then, the frequency information acquisition unit 213 increments w (S17).

When, on the other hand, F[w] is not greater than P1 (No in S14), the frequency information acquisition unit 213 increments w without updating F1 and P1 (S17). Then, the frequency information acquisition unit 213 increments w, and when w becomes equal to or greater than Wmax (No in S13), the process ends. The peak frequency F1 at which the amplitude reaches its maximum value is thereby obtained. Note that, the peak frequency F1 may be calculated by using another method, such as sorting a set of a frequency and an amplitude on the basis of the amplitude and obtaining the peak frequency F1 at which the amplitude reaches its maximum.

Figure 6:
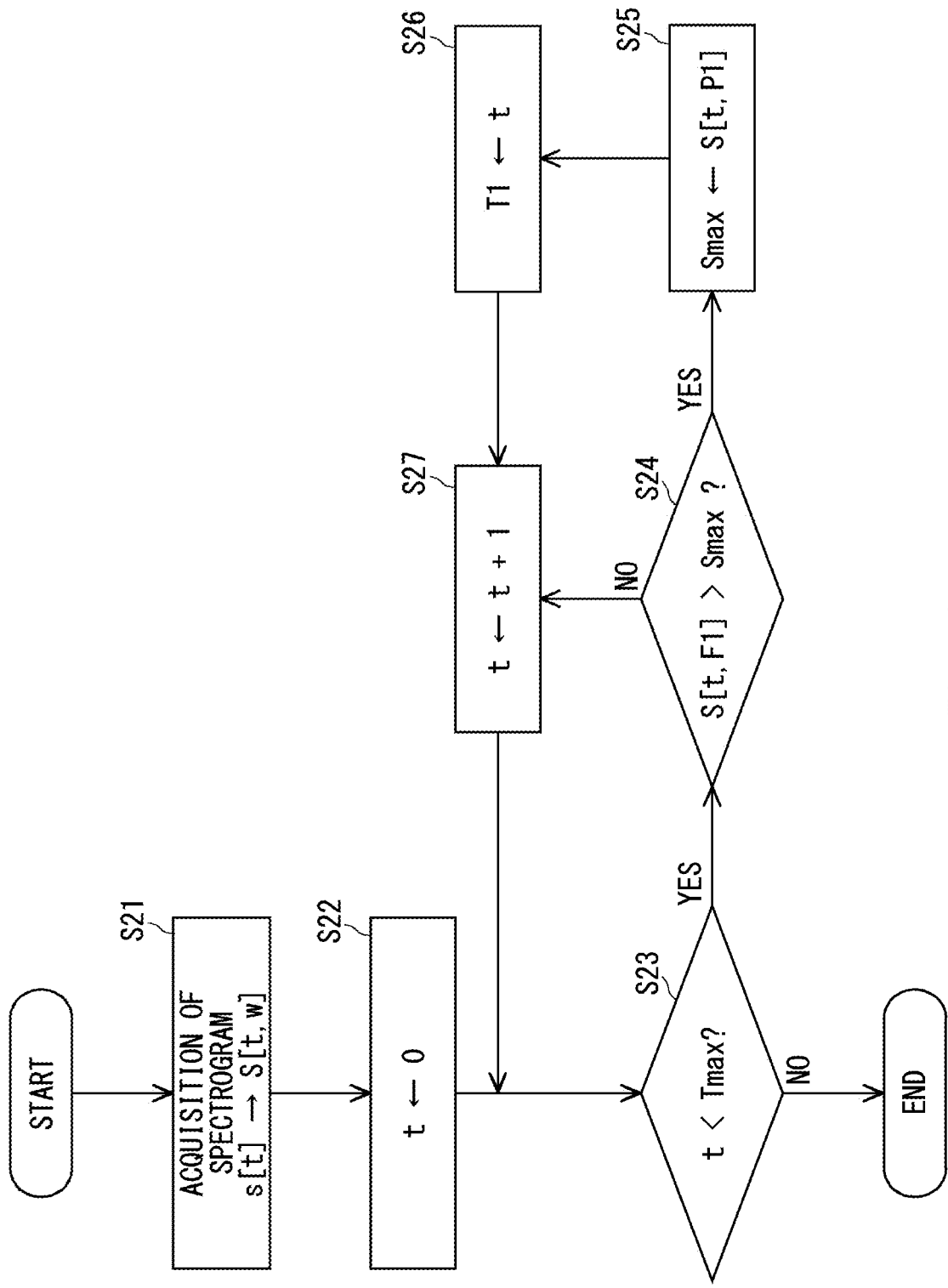
FIG. 6 is a flowchart illustrating a process of acquiring time information.

A process of acquiring the time information is described hereinafter with reference to FIG. 6. FIG. 6 is a flowchart showing an example of processing in the spectrogram acquisition unit 215 and the time information acquisition unit 216. Time t is an integer indicating time of a reproduction signal. To be specific, t is an integer from 0 to Tmax. The start time of a song is 0, and the end time of a song is Tmax. Note that time is not necessarily an integer, and time other than an integer may be used by, for example, assigning numbers to time and managing them in a table or the like, and inputting the time in the table to t in numerical order according to increment of t, which is described later.

First, the spectrogram acquisition unit 215 acquires the spectrogram S[t,w] of the reproduction signal s[t] (S21). For example, the spectrogram acquisition unit 215 acquires the spectrogram S[t,w] by performing short-time Fourier transform (STFT) of the reproduction signal s[t]. Alternatively, the spectrogram may be determined in advance and stored in a memory or the like. In this case, the spectrogram acquisition unit 215 reads the spectrogram S[t,w] from the memory.

Next, the time information acquisition unit 216 inputs 0 to t as an initial value (S22). The time information acquisition unit 216 then determines whether t is smaller than Tmax (S23). When t is smaller than Tmax (Yes in S23), it is determined whether S[t,F1] is greater than Smax (S24). Smax is the maximum value of the amplitude at time less than the time t.

When S[t,F1] is greater than Smax (Yes in S24), the time information acquisition unit 216 inputs S[t,F1] to Smax (S25). Further, the time information acquisition unit 216 inputs t to the peak time T1 (S26). In other words, the time information acquisition unit 216 updates Smax by using S[t,F1] and updates T1 by using t. Then, the time information acquisition unit 216 increments t (S27).

When, on the other hand, S[t,F1] is not greater than Smax (No in S24), the time information acquisition unit 216 increments t without updating Smax and T1 (S27). Then, the time information acquisition unit 216 increments t, and when t becomes equal to or greater than Tmax (No in S23), the process ends. The peak time T1 at which the amplitude reaches its maximum value at the peak frequency F1 is thereby obtained. Note that, the peak time T1 may be obtained by using another method, such as sorting a set of time and a frequency on the basis of the amplitude and obtaining the peak time T1 at which the amplitude reaches its maximum.

The processing method according to this embodiment enables the acquisition of an appropriate gain G. This reduces a feeling of strangeness when the user U performs out-of-head localization listening. Although the processing device 200 performs processing by using the L-ch inverse filter Linv, it may perform processing by using the R-ch inverse filter Rinv. Further, the processing device 200 may perform processing by using both of the L-ch inverse filter Linv and the R-ch inverse filter Rinv. In this case, a smaller value, an average value or the like of gains of the both channels may be used as the gain G.

Further, the processing device 200 is capable of calculating the gain G before a song is reproduced. This eliminates the need to monitor the signal level of a sound source. When a song to be reproduced next is designated or when a song to be reproduced next is predicted, the spectrogram can be calculated in advance. Note that the spectrogram may be calculated for a plurality of songs that are expected to be reproduced. This prevents the occurrence of delay due to processing.

Modified Example 1

Although one frequency and one time point are used for sound volume evaluation in the first embodiment, a plurality of frequencies and a plurality of time points may be used for sound volume evaluation. For example, in a modified example 1, two or more frequencies are acquired as the frequency information. To be specific, the frequency information acquisition unit 213 calculates a plurality of peaks in descending order of amplitude of the frequency response of the filter 211. The frequency information acquisition unit 213 acquires peak frequencies of the plurality of peaks as the frequency information. The frequency information acquisition unit 213 acquires peak frequencies F1, F2, . . . , FN of N (N is an integer of 2 or more) number of peaks as the frequency information.

Then, the time information acquisition unit 216 calculates peak times T1, T2, . . . , TN at which the amplitude reaches its maximum for each of the peak frequencies F1, F2, . . . , FN. The time signal extraction unit 217 extracts time signals for the peak times T1, T2, . . . , TN. The time signal extraction unit 217 thereby extracts N number of time signals A1, A2, . . . , AN. The filter processing unit 218 performs filter processing on each of the time signals A1, A2, . . . , AN. N number of processed time signals FA1, FA2, . . . , FAN are thereby obtained.

The gain acquisition unit 219 calculates N number of gains G1 to GN on the basis of the time signals A1, A2, . . . , AN and the processed time signals FA1, FA2, . . . , FAN. For example, the gain acquisition unit 219 compares the time signals A1, A2, . . . , AN with the processed time signals FA1, FA2, . . . , FAN, respectively. The gain acquisition unit 219 calculates the ratio of a maximum amplitude A1$p$ of the time signal A1 to a maximum amplitude FA1$p$ of the processed time signal FA1 as a gain G1. Likewise, the gain acquisition unit 219 calculates G2=(A1$p$/FA1$p$), . . . GN=(AN$p$/FN1$p$). Then, the gain acquisition unit 219 calculates the maximum value of the gains G1 to GN as the gain G.

Modified Example 2

In a modified example 2, a plurality of time points are calculated for one peak frequency F1. Specifically, at the peak frequency F1, N (N is an integer or 2 or more) number of times T1 to TN in descending order of amplitude are acquired as the time information. Then, the same processing as described in the modified example 1 is performed on the times T1 to TN, and thereby the gains G1 to GN are obtained. The gain acquisition unit 219 calculates the maximum value of the gains G1 to GN as the gain G.

According to the modified examples 1 and 2, the processing device 200 is capable of calculating a more appropriate gain G. The out-of-head localization device 100 reproduces the reproduction signal at a sound volume depending on the gain G. This enables appropriate correction of a sound volume. The user U can thereby listen to the reproduction signal on which out-of-head localization is performed without a feeling of strangeness. The modified example 1 and the modified example 2 may be combined as a matter of course. For example, for each of N number of frequencies F1 to FN, the time information acquisition unit 216 may calculate M number of times as the time information. In this case, the maximum value of N×M number of gains may be used as the gain G.

The processing device 200 may be a device different from the out-of-head localization device 100. For example, in the case of reproducing a reproduction signal by streaming, the processing device 200 is a streaming server that distributes a reproduction signal. On the other hand, the out-of-head localization device 100 is a user terminal such as a personal computer, a smart phone, or a tablet PC. The user U selects a song to be reproduced by operating the out-of-head localization device 100, which is a user terminal. The out-of-head localization device 100 transmits a filter and information about a song to be reproduced to the processing device 200, which is a server. The processing device 200 then calculates a gain value by the above-described processing, and transmits it to the out-of-head localization device 100.

Further, the processing device 200 is not limited to physically one device. For example, some of processing of the processing device 200 shown in FIG. 2 may be performed in a server, and the rest of processing may be performed in a user terminal. To be specific, the user terminal may calculate the frequency response of the filter 211 and transmit it to the processing device 200, which is a server. Alternatively, the user terminal may calculate one or a plurality of peak frequencies and transmit them to the processing device 200.

In the case of performing streaming reproduction, the peak frequency F1 of the filter may be transmitted in advance to the server side, which is the peak frequency F1. The server registers the peak frequency F1 in association with a user account. The server than calculates an appropriate gain and transmits it to the out-of-head localization device 100, which is a user terminal. This achieves reproduction with a gain appropriate for each song.

Second Embodiment

Figure 7:
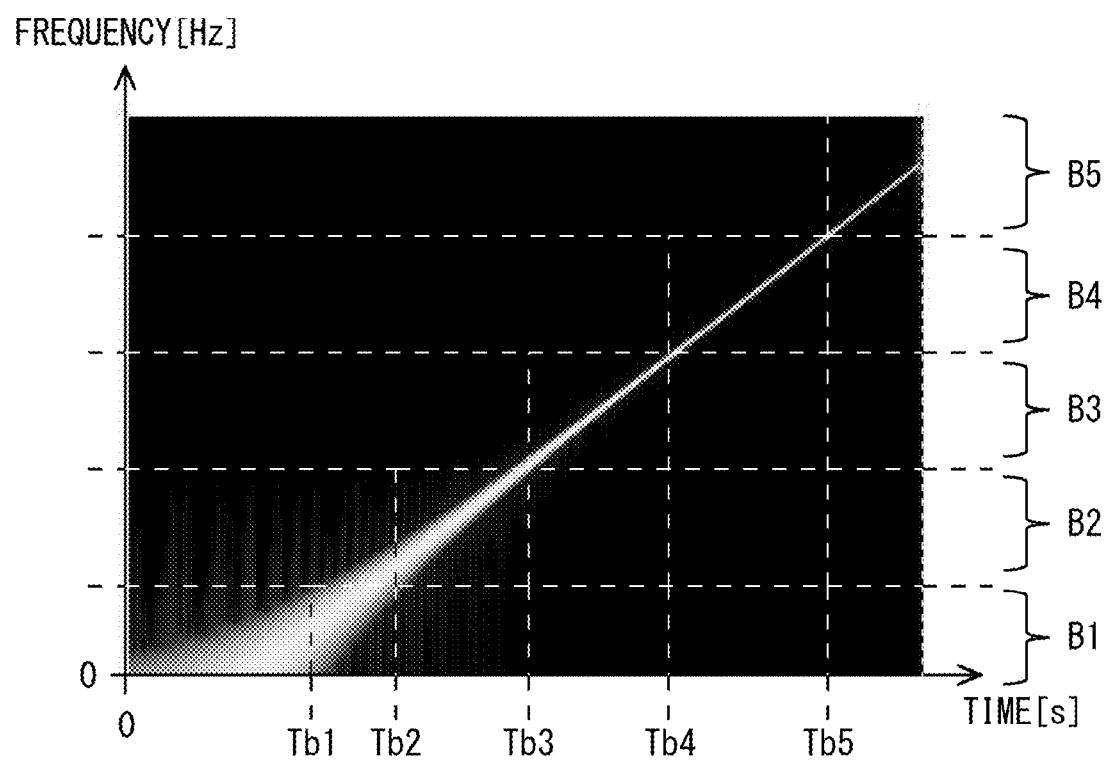
FIG. 7 is a view showing peak times Tb1 to Tb5 in each of frequency bands according to a second embodiment.

Although the peak frequency of a filter and the peak frequency of a reproduction signal are respectively used as the frequency information and the time information for evaluating a sound volume in the first embodiment, a sound volume is evaluated using the frequency information and the time information that are different from them in the second embodiment. A processing device and a processing method according to this embodiment are described hereinafter with reference to FIG. 7. FIG. 7 is a view showing a spectrogram in the case of using a sweep signal as the reproduction signal. In this example, the spectrogram S[t,w] is divided into five frequency bands B1 to B5.

The processing device 200 stores the upper and lower limits of frequencies of the frequency bands B1 to B5. The processing device 200 stores peak times Tb to Tb5 at which the amplitude reaches its maximum in each of the frequency bands B1 to B5. The frequency information acquisition unit 213 calculates the peak frequency F1 in the same manner as in the first embodiment. The time information acquisition unit 216 determines in which of the frequency bands B1 to B5 the peak frequency F1 is included. Specifically, the time information acquisition unit 216 acquires one frequency band selected according to the peak frequency F1 as the frequency information.

The time information acquisition unit 216 acquires, as the time information, a peak time in the frequency band in which the peak frequency F1 is included. For example, when the peak frequency F1 is included in the frequency band B1, the time information acquisition unit 216 obtains the peak time T1 as the time information. Then, the same processing as described in the first embodiment is performed on the time signal A1 extracted on the basis of the peak time T1. The gain G is thereby calculated appropriately.

In the second embodiment, the peak times Tb to Tb5 in the frequency bands B1 to B5 can be calculated in advance. Thus, the peak times Tb to Tb5 can be added as meta-information to a reproduction signal. This eliminates the need to calculate a spectrogram each time a reproduction signal (song to be reproduced) is designated. Specifically, the time information acquisition unit 216 determines in which frequency band the peak frequency F1 is included.

Then, the time information acquisition unit 216 selects one of the peak time Tb to Tb5 according to a determination result.

This enables further reduction of processing load during reproduction. For example, the peak times Tb to Tb5 may be calculated in advance on the server side for each reproduction signal. Then, the user terminal may transmit the peak frequency or the frequency band as the frequency information. Thus, there is no need to calculate a spectrogram each time a reproduction signal (song to be reproduced) is designated. Since the frequency information for each user is known, the processing device 200 can promptly acquire the time information and the time signal. As a matter of course, the number of divided frequency bands of the frequency response of the reproduction signal is not limited to five.

Further, in the first and second embodiments, it is feasible to predict the next song from the currently reproduced song and perform processing beforehand. For example, a part or the whole of processing for calculating a gain may be executed in advance for a song that is recommended by a recommendation feature of a music reproduction application or the like. For example, the spectrogram of the next song in a reproduction list can be calculated beforehand. This enables reduction of processing load.

In the second embodiment also, the time signal extraction unit 217 may extract a plurality of time signals. For example, time signals A1 to A5 are extracted respectively for the peak times Tb to Tb5 at the maximum amplitude. The filter processing unit 218 convolves a filter to each of the time signals A1 to A5 and thereby generates processed time signals FA1 to FA5. The gain acquisition unit 219 compares the time signals A1 to A5 with the processed time signals FA1 to FA5, respectively, and thereby obtains gains G1 to G5. The gain acquisition unit 219 calculates the maximum value of the gains G1 to G5 as the gain G.

Although the processing device 200 performs processing on a filter that is used for out-of-head localization in the first and second embodiments, the filter that is used for out-of-head localization is not particularly limited. For example, the processing device 200 may perform processing on a filter generated by equalizing or the like according to the preference of a user or appropriateness to music, a music genre and the like.

It should be noted that some blocks may be omitted in the block diagrams of FIGS. 1 and 2. For example, in FIG. 2, the spectrogram acquisition unit 215, the filter characteristic acquisition unit 212, the filter 211, and the sound source 214 are omissible. Further, a part or the whole of processing may be omitted in the flowcharts of FIGS. 5 and 6. Since FIG. 5 shows an example of processing of acquiring the frequency information, some or all of the steps of FIG. 5 may be skipped. Further, since FIG. 6 shows an example of processing of acquiring the time information, some or all of the steps of FIG. 6 may be skipped. In other words, the frequency information or the time information may be acquired by processing other than those shown in FIGS. 5 and 6.

A part or the whole of the above-described processing may be executed by a computer program. The above-described program can be stored and provided to the computer using any type of non-transitory computer readable medium. The non-transitory computer readable medium includes any type of tangible storage medium. Examples of the non-transitory computer readable medium include magnetic storage media (such as floppy disks, magnetic tapes, hard disk drives, etc.), optical magnetic storage media (e.g. magneto-optical disks), CD-ROM (Read Only Memory), CD-R, CD-R/W, and semiconductor memories (such as mask ROM, PROM (Programmable ROM), EPROM (Erasable PROM), flash ROM, RAM (Random Access Memory), etc.). The program may be provided to a computer using any type of transitory computer readable medium. Examples of the transitory computer readable medium include electric signals, optical signals, and electromagnetic waves. The transitory computer readable medium can provide the program to a computer via a wired communication line such as an electric wire or optical fiber or a wireless communication line.

Although embodiments of the invention made by the present invention are described in the foregoing, the present invention is not restricted to the above-described embodiments, and various changes and modifications may be made without departing from the scope of the invention.

The present disclosure is applicable to a processing device that performs filter processing.

What is claimed is:

1. A processing device comprising:
a frequency information acquisition unit configured to acquire frequency information on the basis of a frequency response of a filter used in filter processing on a reproduction signal;
a time information acquisition unit configured to acquire, on the basis of the frequency information, time information of a reproduction signal;
an extraction unit configured to extract, on the basis of the time information, a time signal corresponding to at least some time of the reproduction signal;
a filter processing unit configured to perform filter processing using the filter on the time signal; and
a gain acquisition unit configured to acquire a gain for a sound volume of the reproduction signal on the basis of the time signal not having undergone filter processing and a processed time signal having undergone filter processing.

2. The processing device according to claim 1, wherein the frequency information acquisition unit acquires the frequency information corresponding to a peak frequency being a peak in the frequency response of the filter.

3. The processing device according to claim 1, wherein the time information acquisition unit acquires the time information corresponding to a peak time at which an amplitude of the reproduction signal reaches its peak in a frequency or a frequency band based on the frequency information.

4. The processing device according to claim 1, wherein
in the frequency response of the reproduction signal, a plurality of frequency bands are associated with a peak time at which an amplitude reaches its peak in each of the frequency bands,
the frequency information acquisition unit acquires, as the frequency information, the frequency band including a frequency at which the frequency response of the filter reaches its peak, and
the time information acquisition unit acquires, as the time information, the peak time in the frequency band including the frequency acquired as the frequency information.

5. A processing method comprising:
a step of acquiring frequency information on the basis of a frequency response of a filter used in filter processing on a reproduction signal;
a step of acquiring, on the basis of the frequency information, time information of a reproduction signal;
a step of extracting, on the basis of the time information, a time signal corresponding to at least some time of the reproduction signal;
a step of performing filter processing using the filter on the time signal; and
a step of acquiring a gain for a sound volume of the reproduction signal on the basis of the time signal not having undergone filter processing and a processed time signal having undergone filter processing.

6. A reproduction method comprising:
performing out-of-head localization on the reproduction signal by using the filter; and
reproducing the reproduction signal after out-of-head localization at a sound volume depending on a gain calculated in claim 5.

7. A non-transitory computer readable medium storing a program causing a computer to execute a processing method: the processing method comprising:
a step of acquiring frequency information on the basis of a frequency response of a filter used in filter processing on a reproduction signal;
a step of acquiring, on the basis of the frequency information, time information of a reproduction signal;
a step of extracting, on the basis of the time information, a time signal corresponding to at least some time of the reproduction signal;
a step of performing filter processing using the filter on the time signal; and
a step of acquiring a gain for a sound volume of the reproduction signal on the basis of the time signal not having undergone filter processing and a processed time signal having undergone filter processing.

* * * * *